United States Patent [19]

Hurley

[11] Patent Number: 5,004,987
[45] Date of Patent: Apr. 2, 1991

[54] TEMPERATURE COMPENSATED CRYSTAL RESONATOR FOUND IN A DUAL-MODE OSCILLATOR

[75] Inventor: Leslie C. Hurley, Carlisle, Pa.

[73] Assignee: Piezo Crystal Company, Carlisle, Pa.

[21] Appl. No.: 363,595

[22] Filed: May 19, 1989

[51] Int. Cl.⁵ .......................... H03B 5/32; H03L 1/02; G05D 23/20
[52] U.S. Cl. ........................................ 331/70; 331/66; 331/158; 331/176; 310/315
[58] Field of Search .................. 331/60, 66, 69, 70, 331/158, 175, 176; 310/315, 341, 342, 343, 344, 346, 347

[56] References Cited

U.S. PATENT DOCUMENTS

| | | | |
|---|---|---|---|
| 3,322,981 | 5/1967 | Brenig | 310/315 |
| 3,414,794 | 12/1968 | Wood | 310/315 |
| 3,463,945 | 8/1969 | Fewings | 310/315 |
| 3,553,602 | 1/1971 | Brothers et al. | 331/40 |
| 3,561,832 | 2/1971 | Karrer et al. | 310/338 |
| 3,826,931 | 7/1974 | Hammond | 310/361 |
| 3,882,332 | 5/1975 | Frymoyer | 310/318 |
| 3,967,143 | 6/1976 | Watanabe et al. | 310/316 |
| 4,039,969 | 8/1977 | Martin | 331/66 X |
| 4,079,280 | 3/1978 | Kusters et al. | 310/318 |
| 4,215,308 | 7/1980 | Kusters | 324/78 D |

OTHER PUBLICATIONS

Holland, "Nonuniformly Heated Anisotropic Plates: II. Frequency Transients in AT and BT Quartz Plates," 1974, Ultrasonics Symposium Proceedings, IEEE Cat. #74, CHO 896-1SU, pp. 592-598.
Miguel, "A Temperature Compensated SC Cut Quartz Crystal Oscillator," 1982, 36th Annual Frequency Control Symposium, pp. 576-585.
Kusters et al., "Dual Mode Operation of Temperature and Stress Compensate Crystals," pp. 389-397.
EerNisse, "Quartz Resonator Frequency Shifts Arising from Electrode Stress," pp. 1-4.

Primary Examiner—David Mis
Attorney, Agent, or Firm—Mason, Fenwick & Lawrence

[57] ABSTRACT

A device utilizing a quartz crystal resonator with an orientation substantially equal to 21.93°/34.10°. The crystal resonator is capable of vibrating simultaneously in two thickness modes, namely the B-mode and the C-mode. Because of the nature of the difference between the B- and C-modes, the B-mode may be used as an indication of the resonator temperature in order to compensate the C-mode frequency signal. A digital technique for temperature compensation by using the crystal itself as a sensor and a feedback loop varies the heater on the surface of the crystal. The temperature sensor compensation system contains a quartz resonator with a heater affixed thereon. The resonator is arranged as part of the oscillator to generate both B-mode and C-mode frequency signals. The C-mode signal is used as a time standard or frequency reference. Initially, the frequency of the B-mode is counted. The count is started at the same time the frequency count of the C-mode is initiated. The C-mode is then counted to a predetermined frequency value. When the predetermined count is reached for the C-mode, a signal is issued to stop the count of the B-mode frequency. The eight least significant bits of the resultant B-mode count are passed to a D-to-A converter and then used to control a switching regulator which, in turn, alters the temperature of the heater disposed on the crystal resonator. This change in temperature alters the B-mode frequency and, thus, provides a feedback loop to stabilize the C-mode frequency signal.

18 Claims, 2 Drawing Sheets

TEMPERATURE COMPENSATED CRYSTAL RESONATOR FOUND IN A DUAL-MODE OSCILLATOR

BACKGROUND OF THE INVENTION

1. FIELD OF THE INVENTION

The present invention relates to a method and circuit for controlling an output of a dual-mode oscillator, the frequencies of which are produced by an SC-cut quartz crystal generating a B-mode signal and a C-mode signal.

2. DESCRIPTION OF THE PRIOR ART

Within the last decade, a new quartz crystal orientation known as the "SC-cut" has been developed. The SC-cut retains most of the mood qualities of the previous AT cut, such as low frequency-temperature coefficient, and it eliminates some of the bad qualities of the AT cut, such as temperature shock sensitivity. See "A Temperature Compensated SC-cut Quartz Crystal Oscillator" by Edward K. Miguel, *36th Annual Frequency Control Symposium* (1982), pages 576 through 585.

Such crystals have found application in the development of dual-mode oscillators. For example, see "Dual-mode Operation of Temperature and Stress Compensated Crystals" by Kusters et al, pages 389 through 397. Whereas SC-cut crystals provide advantages over prior crystal orientations, they still require operation in a controlled temperature environment over a narrow temperature range in order to achieve good frequency stability.

Therefore, it would be considered desirable to develop a method and circuit for controlling the frequency of the output of a dual-mode crystal oscillator and, more particularly, for controlling the temperature of the dual-mode crystal oscillator so as to control the frequency of the output thereof.

The following patents are considered to be representative of the prior art relative to dual-mode oscillators: U.S. Pat. No. 4,079,280 [Kusters et al (Kusters '280)] and U.S. Pat. No. 4,215,308 [Kusters (Kusters '308)]. See, in particular, columns 2 and 3 of the Kusters '280 patent for a lengthy discussion of the prior art, said discussion incorporated by reference herein.

The Kusters '280 patent relates to a method and apparatus utilizing a quartz crystal resonator with an orientation substantially equal to 21.93°/33.93° vibrating simultaneously in two thickness modes to accurately measure temperature and unknown frequencies or to provide a stable frequency signal source. By combining the quartz crystal resonator with either digital or analog compensation, the frequency-temperature deviation of one of the crystal mode frequencies is used as an internal thermometer and the second crystal mode frequency as a reference frequency signal. The frequency signal for the thermometer function is utilized by the compensation network to correct the measurements made with, or to stabilize, the frequency of the reference frequency signal. Additionally, the analog or digital compensation is accomplished by means of either a curve-fitting routine or an interpolation look-up table routine.

The Kusters '308 patent relates to a method and apparatus for obtaining an accurate measure of the frequency of an applied signal by generating a pair of independent frequency signals wherein one of the independent frequency signals has a frequency value which is indicative of the operating temperature of the counter. The counter has two modes of operation: (1) a calibration mode and (2) a measurement mode.

In the calibration mode, an accurate signal having a pre-selected frequency value is applied to the counter. The frequency of this signal is measured with reference to the other of the pair of independent frequency signals and this measured value is then algebraically combined with a prestored value that is equivalent to the pre-selected frequency of the applied signals. The combined value represents the necessary normalized correction factor for any measured frequency when the counter is at the corresponding temperature. The value of one of the independent frequency signals in this mode serves as a pointer to the memory location where this correction factor is to be stored. This procedure is then repeated several times as the temperature environment of the counter varies.

In the measurement mode, an unknown signal is applied to the counter, its frequency value is measured against the other of the independent frequency signals, the value of the one of the independent frequency signals is utilized as a pointer to the necessary correction factor at the then operating temperature of the counter, the measured frequency value is corrected algebraically with this correction factor, and the final result outputted for further use by the user.

SUMMARY OF THE INVENTION

The present invention relates to a method and circuit for controlling an output of a dual-mode oscillator, the oscillator generating a B-mode signal output and a C-mode signal output. More specifically, the invention relates to a method and circuit which control the frequency of the output of the dual-mode oscillator by selectively adjusting the temperature of the dual-mode oscillator (for example, by adjusting the power applied to a heater adjacent to the oscillator).

As is well known by those of skill in the art, the frequency variation of the B-mode output signal is relatively much more rapid than the frequency variation of the C-mode output signal in an SC-cut crystal. The present invention takes advantage of these characteristics of the B-mode and C-mode signal outputs.

In accordance with the invention, a signal for selectively adjusting the temperature of the piezoelectric crystal in the oscillator is derived by counting in accordance with the C-mode output of the dual-mode oscillator to define a time period for a second counting operation, and then counting in accordance with the B-mode signal output of the dual-mode oscillator for the time period defined by the first counting operation in order to produce a counter output defining a temperature of the dual-mode oscillator. The counter output is then processed to derive a signal for selectively adjusting the temperature of the dual-mode oscillator.

Accordingly, the circuit of the present invention generally comprises a C-mode counter for performing the aforementioned first counting operation to define the time period for the second counting operation, and a B-mode counter for counting in accordance with the B-mode signal output for the time period defined by the first counting operation. Thus, the C-mode signal output is used as a standard frequency, based on which the more rapidly varying B-mode signal output is monitored, the frequency variations in the B-mode signal output are measured, and these measurements are employed to adjust the temperature of the crystal, thus correcting the C-mode signal output in accordance therewith. In this way, the C-mode signal is also available as a stable frequency signal source for use in a device requiring such a signal source.

The circuit also includes a pair of registers which, according to their setting during the counting operations, define whether the crystal temperature is too high, too low or correct. Further elements of the circuit of the present invention are responsive to the setting of the pair of registers so as to produce an analog signal which results in application of no power, full power, or an intermediate amount of power to the heater adjacent to or mounted on the crystal of the dual-mode oscillator.

Therefore, it is a primary object of the present invention to provide a method and circuit for controlling an output of a dual-mode oscillator by selectively adjusting the temperature thereof.

It is an additional object of the present invention to provide a method and circuit for controlling an output of a dual-mode oscillator by performing two counting operations.

It is an additional object of the present invention to provide a method and circuit for controlling an output of a dual-mode oscillator by using a C-mode output of the oscillator to define a time period for counting in accordance with the B-mode output of the oscillator.

The above and other objects of the invention, as will hereinafter appear, and the nature of the invention will be more fully understood by reference to the following detailed description, the appended claims, and the accompanying drawings.

DETAILED DESCRIPTION OF THE PREFERRED EMBODIMENTS

The invention will now be described in more detail by reference to the accompanying drawings.

Figure 1:
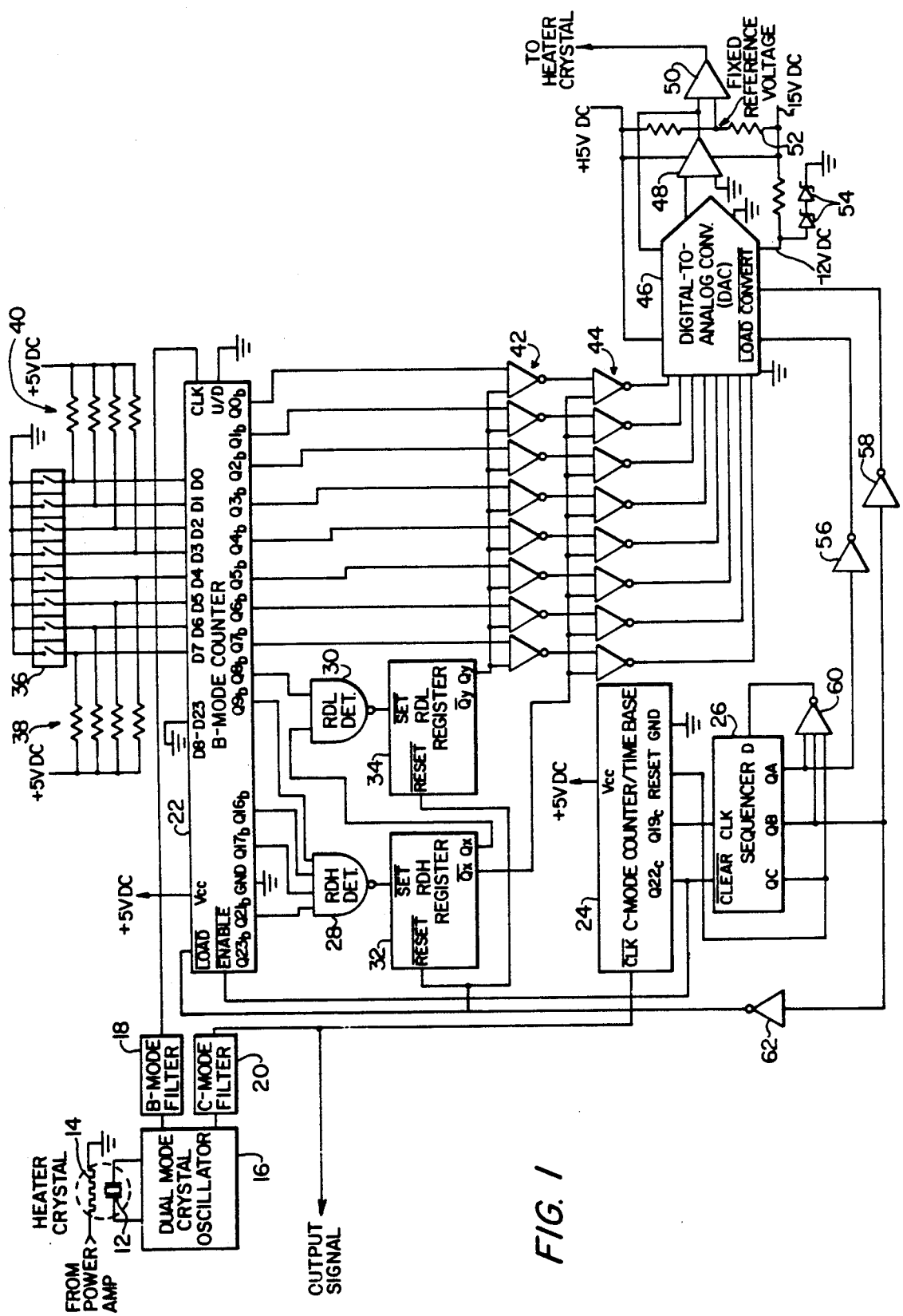
FIG. 1 is a diagram of the circuit for controlling the output of a dual-mode oscillator in accordance with the present invention.

FIG. 1 is a diagram of the circuit for controlling the output of a dual-mode oscillator in accordance with the present invention. As seen therein, a crystal 12 is employed as a part of a dual-mode crystal oscillator 16, and a heater 14 is disposed on a surface 13 of the crystal 12 for the purpose of controlling the temperature thereof. In the oscillator, the frequency of the alternating current output is determined by the mechanical properties of the crystal, which in a preferred embodiment, is a piezoelectric SC-cut crystal with an orientation substantially equal to $21.93°\pm.50°/34.10\pm1.00°$. Of course, it is understood that other known orientations for SC-cut crystals are contemplated.

The circuit 10 of the present invention is connected to the oscillator 16 via a B-mode filter 18 and a C-mode filter 20, the B-mode filter 18 providing the B-mode output signal of the oscillator 16, and the C-mode filter 20 providing the C-mode output signal of oscillator 16, the latter C-mode output signal comprising the output signal of the combined arrangement. The two filters are conventional band pass filters for passing the C-mode frequency, which is nominally 10.00 MHz and the B-mode frequency, which is nominally 10.94 MHz. In a preferred embodiment, the C-mode filter is a narrow band 10 MHz filter, whereas the B-mode filter is a band-pass filter approximately 20 KHz wide and centered at 10.94 MHz.

The circuit 10 basically comprises B-mode counter 22 which receives the B-mode signal as a clock input on line 102, and C-mode counter 24 which receives the C-mode signal as a clock input on line 104. In a preferred embodiment, the B-mode counter is implemented through six 4-stage binary counters arranged in series so that 24 output signals are provided at bits $Q0b$ through $Q23b$, with $Q0b$ being the least significant bit. In turn, a preferred embodiment of the C-mode counter consists of two 12-stage binary counters arranged in series to provide 24 output bits $Q0c$ through $Q23c$ with only bits $Q19c$ and $Q22c$ being employed in the present invention. As with the case of the B-mode counter, $Q0c$ in the C-mode counter represents the least significant bit.

Also provided is a sequencer 26 which, in a preferred embodiment, is implemented as a shift register. The sequencer contains three outputs consisting of bits QA, QB and QC. The $Q22c$ output of the C-mode counter is fed to the negative clear of the sequencer on line 106. In like manner, the $Q19c$ output of the C-mode counter is fed on line 108 to the clock input of sequencer 26.

A read-high (RDH) detector 28 in the form of a four input NAND gate receives signals from the B-mode counter consisting of outputs $Q9b$, $Q16b$, $Q17b$ and $Q21b$. The output of the RDH detector is fed on line 110 to the negative set of an RDH register 32 which, in a preferred embodiment, is in the form of a D-type flip-flop.

In similar fashion, an RDL detector 30, in the form of a two input NAND gate receives the Q output of register 32 and the $Q8b$ output of the B-mode counter. The output of the RDL detector 30 appears on line 112 and provides the negative set to RDL register 34 which, in a preferred embodiment, is in the form of a D-type flip-flop.

Also forming part of the circuit 10 is a digital-to-analog converter (DAC) 46, which has eight input ports T0 through T7 for receiving digital information and an output 114 for providing an analog signal to an amplifier 48 which in turn provides a signal to amplifier 50, the output of which is used to control the heater 14 on the crystal surface 13.

The QA output of the sequencer 26, after passing through an inverter 56, provides an input to the negative load of DAC 46. The QB output of sequencer 26 in turn, after passing through an inverter 62 provides an input signal to the negative reset of register 32 and 34 and an input to the negative load of the B-mode counter. At the same time, the QB output of the sequencer 26 passes through an inverter 58 to provide an input to the negative convert of the DAC 46. The QC output of sequencer 26 provides the reset signal to the C-mode counter 24. Finally, all three outputs of the sequencer pass through a NOR gate 60, which output is fed to the D input of sequencer 26.

The B-mode counter contains eight data input lines D0 through D7, which are tied to a series of eight switches 36 which, in a preferred embodiment, are arranged as conventional dip switches. Connected to each of the data lines between the switches and the inputs of the B-mode counter are pull-up resistors 38 and 40, a single resistor being allocated to each of the lines.

The eight least significant bits at the output of the B-mode counter ($Q0b$ through $Q7b$) are each fed to a separate NOR gate forming part of a NOR gate array 42. Each of the NOR gates in the array is a two-input device, with the free input of each NOR gate being tied to the Q output of register 34. The outputs of each of the NOR gates in the array 42 are fed to an input of a two-input NOR gate forming part of a NOR gate array 44. As in the case of array 42, the free inputs of the NOR gates found in array 44 are tied together and receive the output of the negative Q of register 32. The outputs of the NOR gates in array 44 provide the digital signal to the input stage T0 through T7 of the DAC 46.

Essentially, the temperature sensor compensation system of the present invention relates to a device utilizing a piezoelectric quartz crystal resonator 12 with an orientation substantially equal to 21.93°±.50°/334.10°±1.00°. The system makes use of the fact that the crystal resonator is capable of vibrating simultaneously in two thickness modes, namely the B-mode and the C-mode. Because of the nature of the difference between the B- and C-modes, the B-mode may be used as an indication of the resonator temperature in order to compensate the C-mode frequency signal.

Basically, the present invention uses a digital technique for temperature compensation by using the crystal itself as a sensor in combination with a feedback loop 70 to vary the heater 14 on the surface 13 of the crystal. The present invention could also be implemented using a conventional external oven that surrounds the crystal resonator and the use of a conventional auxiliary sensor in order to detect the temperature of the crystal resonator.

Basically, the temperature sensor compensation system contains a quartz resonator with a heater 14 affixed thereon. The resonator is arranged as part of the oscillator 16 to generate both B-mode and C-mode frequency signals. The C-mode signal is used as a time standard or frequency reference.

Initially, the frequency of the B-mode is counted. The count is started at the same time the frequency count of the C-mode is initiated. The C-mode is then counted to a predetermined frequency value. When the predetermined count is reached for the C-mode, a signal is issued to stop the count of the B-mode frequency. The eight least significant bits of the resultant B-mode count are passed to D-to-A converter 46 and then used to control a switching regulator 49 which, in turn, alters the temperature of the heater disposed on the crystal resonator. This change in temperature alters the B-mode frequency and, thus, provides a feedback loop to stabilize the C-mode frequency signal so that it may be used as a reliable time base or frequency standard for use in a device requiring such a standard.

A detailed description of the operation of the circuit 10 will now be described with reference to the timing diagram of FIG. 2. In particular, it should be noted that the timing diagram of FIG. 2 shows the output bit Q22c of the C-mode counter 24, the enabling input to the B-mode counter 22 (which is the inverse of the output Q22c), the output bit Q19c of the C-mode counter 24 (the clock input to the sequencer 26), and the outputs QA, QB and QC of sequencer 26.

Figure 2:
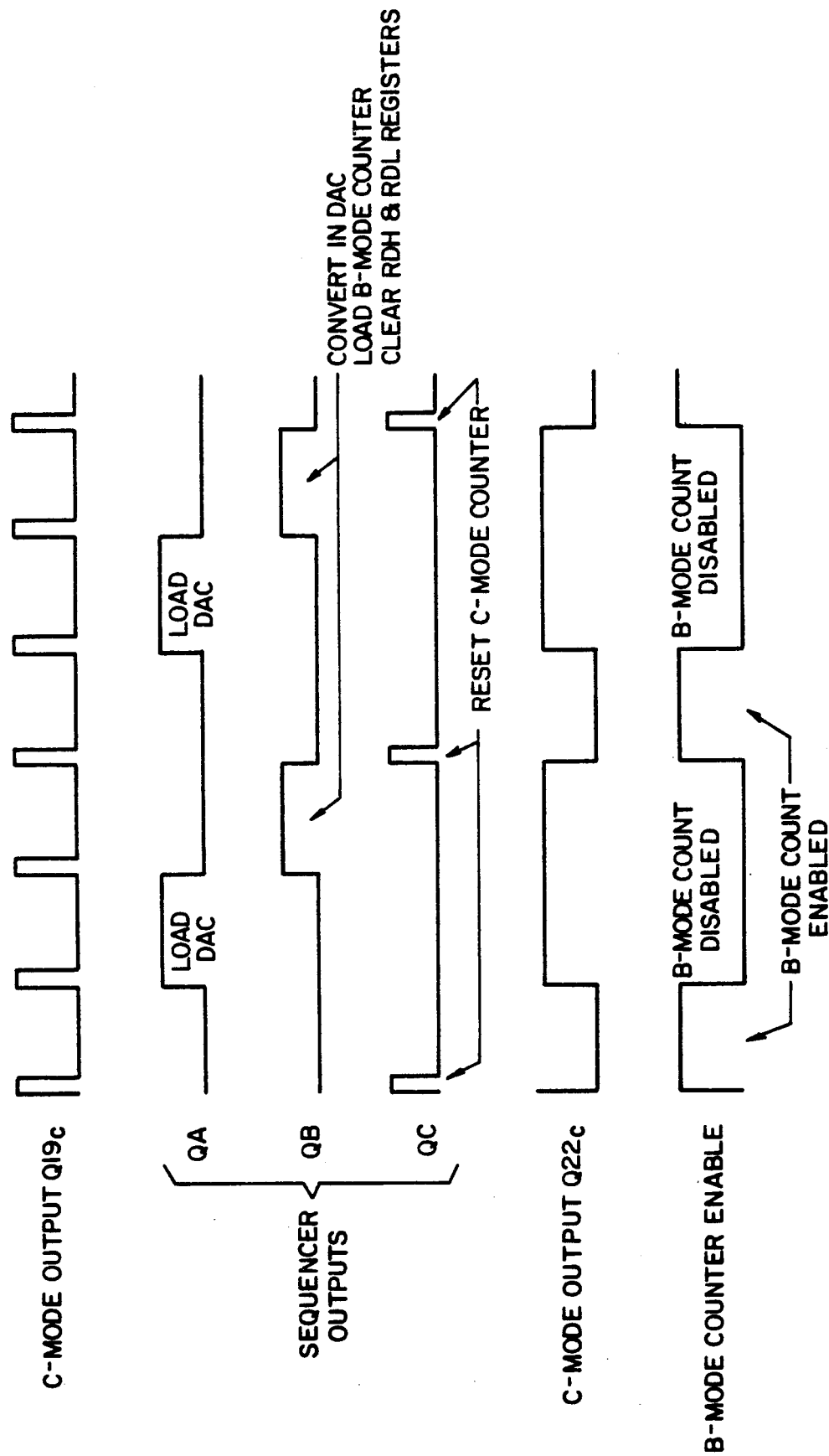
FIG. 2 is a timing diagram relating to the operation of the circuit of FIG. 1.

Referring to FIGS. 1 and 2, in operation, oscillator 16 has its frequencies controlled by the crystal 12, and continuously generates two signals: a C-mode signal which has a zero temperature coefficient of frequency at two temperatures, known as the lower turnover (LT) and the upper turnover (UT), respectively; and a B-mode signal which has a fairly linear temperature coefficient of frequency of about $-26.5$ ppm per °C., the frequency of the B-mode signal being about 1.094 times the frequency of the C-mode signal. The temperature of crystal 12 is held constant within a small error band at one of the turnover temperatures by a heater 14, preferably a heater element deposited on an inactive area of the crystal 12. The heater 14 is excited by power generated by comparator/amplifier 50 as a result of the operation of the circuit 10.

At the output of oscillator 16, the B-mode filter 18 and C-mode filter 20 separate the B-mode and C-mode signals, respectively. The C-mode signal forms the ultimate precision output signal of the arrangement. In addition, the C-mode signal is provided as a clock input to the C-mode counter 24, the C-mode counter 24 preferably being a binary divider chain. As already mentioned, the C-mode counter is implemented through two 12-stage binary counters arranged in series. The two counters include 24 bits arranged from Q0c to Q23c. However, only bits Q19c and Q22c are used in the present invention. The C-mode counter 24 runs continuously but is periodically reset to zero count by the QC output of sequencer 26. As will be seen below, the C-mode counter 24 provides a precision time base for controlling the counting operation, and specifically the counting period, of the B-mode counter 22.

The B-mode output of filter 18 is applied as a clocking signal to the B-mode counter 22, which is preferably a binary divider chain. As already mentioned, the B-mode counter is implemented through six 4-stage binary counters arranged in series with Q0b representing the least significant bit (LSB). Loading of data into the B-mode counter is controlled by the QB output of sequencer 26, and the counting operation performed by counter 22 is enabled by the Q22c output of counter 24.

With respect to loading of data into counter 22 under the control of counter 24, the counter 22 is periodically pre-loaded with a starting count, called the "pre-set" or "off-set" count, such data corresponding to the setting of off-set switches 36 which are connected, via pull-up resistors 38 and 40, to the D0 through D7 input of the counter 22. The pre-set count is adjusted for a maximum C-mode frequency as measured by an external frequency counter. It is contemplated that the pre-set count will be set during manufacture and normally not changed. However, the count could be modified to compensate for aging effects.

Once the B-mode counter 22 is loaded with a starting count, it counts upward from that count as enabled by a low output bit Q22c of C-mode counter 24, and as clocked by the B-mode signal output of filter 18.

Referring to FIG. 2, once the output Q22c of C-mode counter 24 goes high, the B-mode counter 22 is disabled, and counting is interrupted. Thus, the Q22c output of C-mode counter 24 defines a precision time interval during which the B-mode counter 22 performs its counting function.

If, during the counting interval of B-mode counter 22, counter bits Q9b, Q16b, Q17b and Q21b are not simultaneously high, RDH (read high) detector 28 provides a high input to the inverted SET input of register 32, and register 32 remains in its cleared state. This condition occurs when the B-mode frequency of the output of oscillator 16 is below its control range due to the fact that the temperature of crystal 12 is too high. As a result, the inverted QX output of register 32 is high, and the high temperature override NOR gates 44 provide low outputs T0 through T7 to DAC 46. Accordingly, the power signal provided by DAC 46, via amplifier 48 and comparator/amplifier 50, to the crystal heater 14 is turned completely off.

If, during the counting interval of B-mode counter 22, counter bits Q9b, Q16b, Q17b and Q21b are simultaneously set high, RDH detector 28 provides a low output to the inverted SET input of register 32, and register 32 is set. Once register 32 is set, the inverted QX output thereof goes low, and the QX output goes high. The high QX output of register 32 is applied as an input to RDL (read low) detector 30 enabling it to perform low temperature detection based on the condition of its other input, the Q8b output of counter 22.

If, during the counting interval of B-mode counter 22, RDH register 32 becomes set as just described above, and if subsequently bit Q8b of counter 22 becomes high, RDL detector 30 responds to its two high inputs by providing a low input to the inverted SET input of register 34, setting register 34. The latter condition occurs when the frequency of the B-mode signal output is above its control range due to the fact that the temperature of crystal 12 is too low. Once RDL register 34 is set, its QY output goes high, causing low temperature override NOR gates 42 to provide low outputs. Since the inverted QX output of register 32 is also low, high temperature override gates 44 provide high outputs T0 through T7 to the DAC 46. As a result, DAC 46 provides a maximum power output signal via amplifier 48 and comparator/amplifier 50 to the heater 14 via line 51, causing heater 14 to be completely on.

If, during the counting interval of B-mode counter 22, RDH register 32 is set as described above, and if subsequently bit Q8b of B-mode counter 22 stays low, RDL register 34 is not set and the QY output thereof is low. Since the inverted QX output of register 32 is also low, the data appearing on bits Q0b through Q7bof B-mode counter 22 are inverted by gates 42, reinverted by gates 44, and then provided as outputs T0 through T7 to the input of DAC 46. The latter condition occurs when the frequency of the B-mode output signal of filter 18 is within its control range due to the fact that the temperature of crystal 12 is correct or nearly correct. As a result, DAC 46 provides a power output signal via amplifier 48 and comparator/amplifier 50 to the heater 14, and that power output signal corresponds in its analog value to the digital input received by DAC 46 via gates 42 and 44 from the eight least significant bits of counter 22.

Further referring to FIGS. 1 and 2, when the count in the C-mode counter 24 reaches a point where bit Q22c rises to a high condition, this high output is applied to the inverted ENABLE input of B-mode counter 22, thus inhibiting further counting by B-mode counter 22. As a result, for the balance of the sequence cycle, all of the output bits of B-mode counter 22 remain fixed.

The high output on output Q22c of C-mode counter 24 is also applied to the inverted CLEAR input of sequencer 26, pulses from output Q19c of C-mode counter 22 continue while pulses from output Q19c of C-mode counter 24 continue to clock the sequencer 26 via its CLK input. When the sequencer 26 is clear (low outputs at QA, QB and QC), the output of gate 60 is high; otherwise, the output of gate 60 is low and a high condition is shifted through the sequencer 26 as it is clocked by the Q19c output of counter 24 (see FIG. 2).

Further referring to FIGS. 1 and 2, when QA of the sequencer 26 is high, a low input is provided by inverter 56 to the inverted LOAD input of DAC 46, and the contents of gate outputs T0 through T7 are loaded into DAC 46.

When QB of sequencer 26 goes high, the input registers (not shown) of the DAC 46 are latched, and conversion takes place in DAC 46. The resulting analog signal output from DAC 46 is provided via amplifier 48 to one input of comparator/amplifier 50, the other input of which receives a fixed reference voltage via resistor 52. The amplified analog signal output of DAC 46 is thus compared to the fixed DC reference voltage, and the difference is amplified and then applied to crystal heater 10 as the controlled heater power input.

The high on output QB of sequencer 26 is also inverted by inverter 62, and the resulting low output is applied to the inverted LOAD input of the B-mode counter 22. This causes counter 22 to be pre-loaded with an off-set or preset value manually selected by the operator by closing appropriate off-set select switches 36. In this manner, the exact crystal operating temperature can be selected.

The inverted QB output of sequencer 26 is also applied by inverter 62 to the inverted RESET inputs of registers 32 and 34, thus preparing them for the next count sequence.

When bit QC of sequencer 26 rises to a high condition, the high output is applied to the RESET input of C-mode counter 24, thus resetting counter 24. This causes all of the outputs of counter 24, including output Q22c, to go low. This action in turn clears the sequencer 26 and holds it clear until the end of the next count sequence of counter 24. That is to say, once output Q22c of counter 24 goes high, sequencer 26 is once again enabled to shift a high condition through bits QA, QB and QC.

The low condition on bit Q22c of counter 24 also enables the B-mode counter 22 via its inverted ENABLE input, so that it begins counting up from the pre-loaded off-set or pre-set value discussed above.

While preferred forms and arrangements have been shown in illustrating the invention, it is to be understood that various changes in detail and arrangement may be made without departing from the spirit and scope of this disclosure.

What is claimed is:

1. A circuit for controlling an output of a dual-mode oscillator including a crystal resonator, wherein the output of the dual-mode oscillator comprises a first signal and a second signal, comprising:
   first counting means for counting in accordance with the first signal to produce a first output defining a time period;
   second counting means for counting in accordance with the second signal for the time period defined by the first output to produce a second output defining a temperature of the crystal resonator; and
   processing means for processing the second output to derive a temperature control signal for selectively adjusting the temperature of the crystal resonator.

2. The circuit of claim 1, further comprising:
   heating secured to said resonator for altering the temperature of said resonator in response to said temperature control signal from said processing means.

3. The circuit of claim 2, further comprising:
   override means for determining when said temperature of the crystal resonator is higher or lower than predetermined upper and lower limits; and means for maximizing said temperature control signal when said temperature of said crystal resonator is lower than said lower limit and for minimizing said temperature control signal when said temperature of said crystal resonator is higher than said upper limit.

4. The circuit of claim 3, wherein said minimum value of said temperature control signal is zero.

5. The circuit of claim 1, wherein said second counting means includes means for producing said second output in digital form, and said processing means includes means for converting said second output in digital form into said temperature control signal in analog form.

6. A circuit for controlling an output of a dual-mode oscillator that includes an SC-cut crystal resonator, wherein the output of the dual-oscillator comprises a B-mode frequency signal and a C-mode frequency signal, said circuit comprising:
   first counting means for counting in accordance with the C-mode frequency signal to produce a first output defining a time period;
   second counting means for counting in accordance with the B-mode frequency signal for the time period defined by the first output to produce a second output defining a temperature of the crystal resonator; and
   processing means for processing the second output to derive a temperature control signal for selectively adjusting the temperature of the crystal resonator.

7. The circuit of claim 6, further comprising a heating means secured to said resonator for altering the temperature of said resonator in response to said signal from said processing means.

8. The circuit of claim 7, further comprising:
   override means for determining when said temperature of the crystal resonator is higher or lower than predetermined upper and lower limits; and
   means for maximizing said temperature control signal when said temperature of said crystal resonator is lower than said lower limit and for minimizing said temperature control signal when said temperature of said crystal resonator is higher than said upper limit.

9. The circuit of claim 8, wherein said minimum value of said temperature control signal is zero.

10. The circuit of claim 6, wherein said second counting means includes means for producing said second output in digital form, and mail processing means includes means for converting said second output in digital form into said temperature control signal in analog form.

11. A system for frequency control in an SC-cut quartz crystal resonator, said system comprising:
    an electrically operated heating means secured to said crystal;
    a dual-mode crystal oscillator operatively connected to said crystal resonator for producing a B-mode frequency signal and a C-mode frequency signal;
    first counting means for counting the frequency of said B-mode signal;
    second counting means for counting the frequency of said C-mode signal to a predetermined frequency value;
    means for causing said first counting means to stop counting when said second counting means reaches said predetermined frequency value; and
    means responsive to the count of said stopped first counting means for controlling said heating means, wherein the change in the temperature of said crystal resonator alters the B-mode frequency signal resulting in a stabilization of said C-mode frequency signal.

12. The system of claim 11, wherein said first counting means comprises a first binary counter with a clock input for receiving said B-mode frequency signal, and said second counting means comprises a second binary counter with a clock input for receiving said C-mode frequency signal.

13. The system of claim 11, further comprising an overriding means for deactivating said heating means.

14. The system of claim 13, said overriding means further comprising means for operating said heating means at full power.

15. A method for controlling an output of a dual-mode oscillator including a crystal resonator, wherein the output of the dual-mode oscillator comprises a first signal and a second signal, comprising the steps of:
    counting in accordance with the first signal to produce a first output defining a time period;
    counting in accordance with the second signal for the time period defining the first output to produce a second output defining a temperature of the crystal resonator; and
    processing the second output to derive a temperature control signal for selectively adjusting the temperature of the crystal resonator.

16. The method of claim 15, further comprising the step of altering the temperature of a surface of the crystal resonator in response to the temperature control signal.

17. The method of claim 16, further comprising the steps of:
    determining when the temperature of the crystal resonator is higher or lower than predetermined upper and lower limits; and
    maximizing the temperature control signal when said temperature of the crystal resonator is lower than the lower limit and minimizing the temperature control signal when the temperature of the crystal resonator is higher than said upper limit.

18. The method of claim 17, wherein the minimum value of the temperature control signal is zero.

* * * * *